United States Patent
Inoue et al.

(10) Patent No.: US 6,329,044 B1
(45) Date of Patent: Dec. 11, 2001

(54) TRANSPARENT CONDUCTIVE FILM AND METHOD OF MAKING THE FILM

(75) Inventors: Katsumi Inoue; Yasuhiko Akao, both of Yonezawa; Satoru Takaki; Yasuo Hayashi, both of Yokohama; Teruo Fujiwara, Tokyo, all of (JP)

(73) Assignee: Asahi Glass Company Ltd., Tokyo (JP)

( * ) Notice: Subject to any disclaimer, the term of this patent is extended or adjusted under 35 U.S.C. 154(b) by 0 days.

(21) Appl. No.: 09/344,803

(22) Filed: Jun. 25, 1999

(30) Foreign Application Priority Data

Jun. 25, 1998 (JP) .................................................. 10-178778

(51) Int. Cl.[7] ................................ B32B 9/00; G08C 19/00
(52) U.S. Cl. .......................... 428/209; 428/428; 428/432; 428/469; 428/697; 428/702; 178/18.01; 345/173
(58) Field of Search ..................................... 428/426, 689, 428/697, 702, 333, 913, 209, 432, 469, 428; 178/18.01, 18.04; 345/173

(56) References Cited

U.S. PATENT DOCUMENTS

| | | | |
|---|---|---|---|
| 4,835,061 | * | 5/1989 | Ohta et al. ............................ 428/469 |
| 5,411,972 | * | 5/1995 | Yukinobu et al. .................... 428/212 |
| 5,421,926 | * | 6/1995 | Yukinobu et al. ...................... 156/83 |

FOREIGN PATENT DOCUMENTS

| | | |
|---|---|---|
| 60-121606 | 6/1985 | (JP) . |
| 402265113A | * 10/1990 | (JP) . |
| 4-308612 | 10/1992 | (JP) . |
| 405291726A | * 11/1993 | (JP) . |
| 6-135742 | 5/1994 | (JP) . |
| 7-223814 | 8/1995 | (JP) . |
| 7-224374 | 8/1995 | (JP) . |
| 7-224383 | 8/1995 | (JP) . |
| 408083912A | * 3/1996 | (JP) . |
| 1499573A1 | * 3/1992 | (SU) . |

* cited by examiner

*Primary Examiner*—Deborah Jones
*Assistant Examiner*—Stephen Stein
(74) *Attorney, Agent, or Firm*—Oblon, Spivak, McClelland, Maier & Neustadt, P.C.

(57) ABSTRACT

Transparent conductive films are provided which provide high sheet resistance, high transparency, high heat resistance and high moisture resistance, wherein the transparent conductive films contain either (a) an oxide film made of a mixed oxide of indium and tin and doped with at least 0.01 and less than 0.6 weight % of nitrogen and a geometrical thickness of from 5 to 25 nm or (b) an oxide film made of a mixed oxide of indium and tin, wherein the oxide film contains tin within a range of from 4.2 to 8.3 atomic % based on indium and a geometrical thickness of from 5 to 20 nm, and where in each case (a) and (b) the oxide film has a light transmittance of more than 90% at a wavelength of 550 nm, transparent conductive film-coated substrates prepared therefrom and touch panels prepared from the transparent conductive film-coated substrates.

24 Claims, 1 Drawing Sheet

TRANSPARENT CONDUCTIVE FILM AND METHOD OF MAKING THE FILM

BACKGROUND OF THE INVENTION

1. Field of the Invention

This invention relates to a transparent conductive film used for a touch panel, especially for an analog type touch panel, method of making the transparent conductive film, a transparent conductive film-coated substrate and a touch panel having the transparent conductive film-coated substrate.

2. Discussion of the Background

Various transparent conductive films for display electrodes, such as liquid crystal displays (LCD) or plasma displays, have been developed. The transparent conductive film for such uses is generally desired to have low electrical resistance.

Sputtering is widely used as an industrial manufacturing method for transparent conductive film having a low electrical resistance. Generally the method has the following steps: placing a transparent insulated substrate and a target made of the desired material of the transparent conductive film in a chamber, and heating the substrate up to at least 200° C. under vacuum, then introducing argon gas and oxygen gas into the chamber and applying a DC negative voltage to the target whereby the transparent conductive film is formed on the substrate. In order to reduce the electrical resistance of the transparent conductive film, the indium oxide target doped with tin oxide within a range of from 5 to 15 weight % (based on $In_2O_3+SnO_2$) is usually used. At the present time, especially, since low electrical resistance of no more than 300 $\mu\Omega\cdot cm$ is required, indium oxide doped with 10 weight % of tin oxide is often used as a standard target for the transparent conductive film.

Films made by this method should be a thin film having a thickness of not more than 10 nm when used for an analog type touch panel, because such panels require a high sheet resistance, such as from about 500 to about 1000 $\Omega/sq$. The definition of $\Omega/sq$ is shown in "Thin Film Phenomena, K. L. Chopra, p. 388, 1969, McGraw-Hill". However, such thin films tend to be insufficient in heat resistance or moisture resistance.

As a method of increasing the sheet resistance of a mixed film of indium oxide and tin oxide (hereinafter referred to as an ITO film) produced by sputtering when the film is more than 10 nm thick, the temperature of the substrate can be reduced while sputtering. In that case, however, sufficient heat resistance or moisture resistance cannot be obtained.

JP-A-4-308612 shows that a transparent conductive film which is made of ITO doped with nitrogen is produced by sputtering under an atmosphere containing nitrogen and that the transparent conductive film is suitable for an analog type touch panel from the standpoint of high sheet resistance, high transparency and high moisture resistance. However, the transparent conductive film does not have a sufficiently high transparency required for recent touch panels.

SUMMARY OF THE INVENTION

Accordingly, one object of the present invention is to provide a transparent conductive film having high sheet resistance, high transparency, high heat resistance and high moisture resistance.

Another object of the present invention is to provide a transparent conductive film-bonded substrate prepared from the present transparent conductive film.

A further object of the present invention is to provide a touch panel containing the above film-coated substrate.

These and other objects of the present invention have been satisfied by the discovery of a transparent conductive film comprising an oxide film comprised of a mixed oxide of indium and tin, said oxide film doped with nitrogen in an amount of at least 0.01 wt. % and less than 0.6 wt. % in the film, wherein the geometrical thickness of the transparent conductive film is from 5 to 25 nm and the light transmittance of the transparent conductive film is more than 90% at a wavelength of 550 nm.

In a further embodiment of the present invention, a transparent conductive film is provided consisting essentially of an oxide film made of a mixed oxide of indium and tin, said oxide film containing tin within a range of from 4.2 to 8.3 atomic % based on indium, wherein the geometrical thickness of the transparent conductive film is from 5 to 20 nm and the light transmittance of the transparent conductive film is more than 90% at a wavelength of 550 nm.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION OF THE PREFERRED EMBODIMENTS

Figure 1:
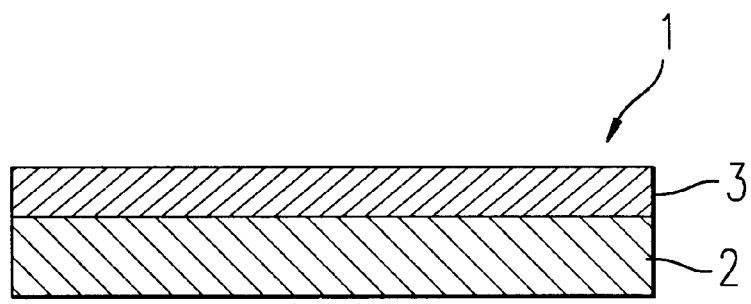
FIG. 1 is a cross sectional view of an embodiment of a transparent conductive film-coated substrate of the present invention.

One embodiment of transparent conductive film of this invention is a high sheet resistance film comprising an ITO film doped with nitrogen, at a level of at least 0.01 weight % and less than 0.6 weight %. The film has a thickness of 5 to 25 nm and a light transmittance of more than 90% at a wavelength of 550 nm. From the standpoint of heat resistance and moisture resistance, it is preferred that more nitrogen is doped to the film and that the film is thicker. On the other hand, from the standpoint of high transparency, it is preferred that less nitrogen is doped to the film and that the film is thinner. Additionally, from the standpoint of high sheet resistance it is preferred that more nitrogen is doped to the film and that the film is thinner. Therefore the amount of doped nitrogen can be determined and appropriately adjusted within the stated range by one of ordinary skill, depending on the characteristics required for a specific film.

In order that the light transmittance of the film exceeds 90%, the amount of doped nitrogen is adjusted to within a range of at least 0.01 weight % and less than 0.6 weight %, preferably at least 0.2 weight % and less than 0.6 weight %, particularly preferably at least 0.4 weight % and less than 0.6 weight %.

In this first aspect of this invention, the content of tin based on indium in the transparent conductive film is preferably from 4.2 to 12.0 atomic %, more preferably from 4.2 to 8.3 atomic %, particularly preferably from 4.2 to 7.5 atomic %, and most preferably from 4.2 to 7.0 atomic %.

The sheet resistance of the film is preferably from 200 to 2000 $\Omega/sq$ more preferably from 400 to 1200 $\Omega/sq$, particularly preferably 800 to 1200 $\Omega/sq$.

The light transmittance of the film itself is more than 90%, preferably at least 93%, more preferably at least 94%, particularly preferably at least 98% at a wavelength of 550 nm.

The thickness of the film is from 5 to 25 nm, preferably from 5 to 15 nm, more preferably from 7 to 15 nm. From the standpoint of light transmittance, the thickness of the film is preferably at most 14 nm, more preferably at most 10 nm, particularly preferably less than 10 nm.

The transparent conductive film of this first aspect of the present invention can be produced, for example, by sputtering to a transparent insulated substrate using a target made of a mixed oxide of indium and tin under an atmosphere containing nitrogen gas, so that an ITO film doped with at least 0.01 weight % and less than 0.6 weight % of nitrogen, having the geometrical thickness of from 5 to 25 nm and a light transmittance of more than 90% at a wavelength of 550 nm, is formed. The amount of doped nitrogen can be identified by the ESCA analyzing method. From this analysis nitrogen molecules are found to be coordinated replacing a portion of the oxygen molecules in the film.

More specifically, nitrogen molecules can be introduced into the ITO film by employing DC magnetron sputtering using a target made of a mixed oxide of indium and tin, and by introducing 1) inert gas and nitrogen gas or 2) inert gas, nitrogen gas and oxidizing gas into a vacuum chamber where the sputtering is conducted.

As a method of forming film, any sputtering method can be used, including, but not limited to, DC sputtering methods and RF sputtering methods. In addition, other film forming methods, such as vacuum deposition or ion plating, can also be employed. When using a mixed oxide of indium oxide and tin oxide as a target material, the tin oxide content in the target is preferably from 1 to 15 weight %, more preferably from 4.5 to 12 weight %. A target made of a mixed oxide of indium oxide and tin oxide or a target made of an alloy of indium and tin can be used for the target.

While forming the film it is preferred that the substrate is heated, preferably to a temperature of at least 300° C., more preferably from 300 to 400° C.

As the transparent insulated substrate, any transparent material capable of receiving, a deposited film can be used. Suitable examples include a transparent plastic film made of polyester, polycarbonate, polyethersulphone or the like, or glass sheets. The thickness of the substrate is preferably 50–250 μm, more preferably 100–200 μm, when the substrate is a plastic film.

When using a glass sheet as the substrate, it is preferably a soda lime glass sheet having at least one surface covered by a film of silicon oxide. Glass sheet having silicon oxide films on both surfaces is preferred. The thickness of the film of silicon oxide is preferably 50–120 nm, more preferably 60–100 nm.

A film can be formed on a glass substrate under high temperature, such as 200–500° C., preferably 300–400° C., which is different from the case of using plastic film substrates. Therefore high transparency, good heat resistance and good moisture resistance can be easily achieved at the same time. The glass substrate has the advantage that the resistibility of the conductive film can be adjusted by varying the heating temperature, and that it can keep high transparency even when its thickness is large. The thickness of the glass substrate is preferably 0.4–1.8 mm, more preferably 0.4–1.1 nm.

A suitable example of inert gas used for the film forming method is argon, but helium or neon can also be used. Any oxidizing gas can be used in the film forming method, but either of oxygen gas or carbon dioxide gas are preferred. The oxidizing gas content in the atmosphere is preferably 0–10 volume %, more preferably 0–7 volume %. The nitrogen gas content in the atmosphere is preferably 0.1–10 volume %, more preferably 0.1–8 volume %.

The thickness of the conductive film is readily controlled by duration of the sputtering, amount of applied electric power and so on. In order to achieve sheet resistances of 400–1200 Ω/sq and transparency of the film of at least 93%, the film is formed such that its thickness is 7–15 nm.

The transparency (the light transmittance at a wavelength of 550 nm) of the film-coated substrate on which the transparent conductive film of this first aspect of the present invention is formed is preferably at least 90%.

A second aspect of the present invention provides a transparent conductive film consisting essentially of an oxide film made of a mixed oxide of indium and tin, the oxide film containing tin within a range of from 4.2 to 8.3 atomic % based on indium, wherein its geometrical thickness is from 5 to 20 nm and its light transmittance at a wavelength of 550 nm is more than 90%.

The content of tin based on indium in the transparent conductive film of this second aspect of the invention is from 4.2 to 8.3 atomic %, preferably from 4.2 to 7.5 atomic %, more preferably from 4.2 to 7.0 atomic %.

The sheet resistance of the film is preferably from 200 to 2000 Ω/sq, more preferably from 400 to 1200 Ω/sq, particularly preferably 400 to 700 Ω/sq.

The light transmittance of the film is more than 90%, preferably at least 93%, more preferably at least 94%, particularly preferably at least 98% at a wavelength of 550 nm.

The thickness of the film is from 5 to 20 nm, preferably from 5 to 15 nm, more preferably from 7 to 15 nm. From the standpoint of light transmittance, the thickness of the film is preferably at most 12 nm, more preferably at most 10 nm, particularly preferably less than 10 nm.

The transparent conductive film of this second aspect of the present invention can be produced, for example, by sputtering to a transparent insulated substrate using a target made of a mixed oxide of indium and tin under an atmosphere containing inert gas or a mixed gas of inert gas and oxidizing gas, so that an ITO film consisting essentially of tin oxide and indium oxide, is formed having a tin content in the film of from 4.2 to 8.3 atomic % (based on the indium content), and having a geometrical thickness of 5–20 nm and a light transmittance of more than 90% at a wavelength of 550 nm. The same film forming methods as that of the first aspect of this invention can be used. However, in this second aspect of the invention, nitrogen gas is not required.

While forming the film it is preferred that the substrate is heated. In this case the heating temperature is preferably at least 300° C., more preferably 300–400° C.

The tin oxide content in the mixed oxide sputtering target is preferably from 4.5 to 8 weight %, more preferably from 4.5 to 7.5 weight %. For the target, a target made of an alloy of indium and tin can also be used.

The thickness of the conductive film can be controlled by duration of the sputtering, amount of applied electric power and so on. In order to achieve the target sheet resistance of 400–1200 Ω/sq and transparency of the film of at least 93%, the film is desirably formed such that its thickness is 7–15 nm.

Regarding the transparent insulated substrate, substantially the same substrate material as described above in the case of the first aspect of the invention can be used. If higher transparency or better heat resistance is required, it is preferred to use a glass substrate.

When using a glass sheet as the substrate, it is preferably a soda lime glass sheet having at least one surface covered by a film of silicon oxide. Glass sheet having silicon oxide films on both surfaces is preferred. The thickness of the film of silicon oxide is preferably 50–120 nm, more preferably 60–100 nm.

The light transmittance at a wavelength of 550 nm of the film-coated substrate on which the transparent conductive film of the second aspect of the present invention is formed is preferably at least 90%.

Figure 2:
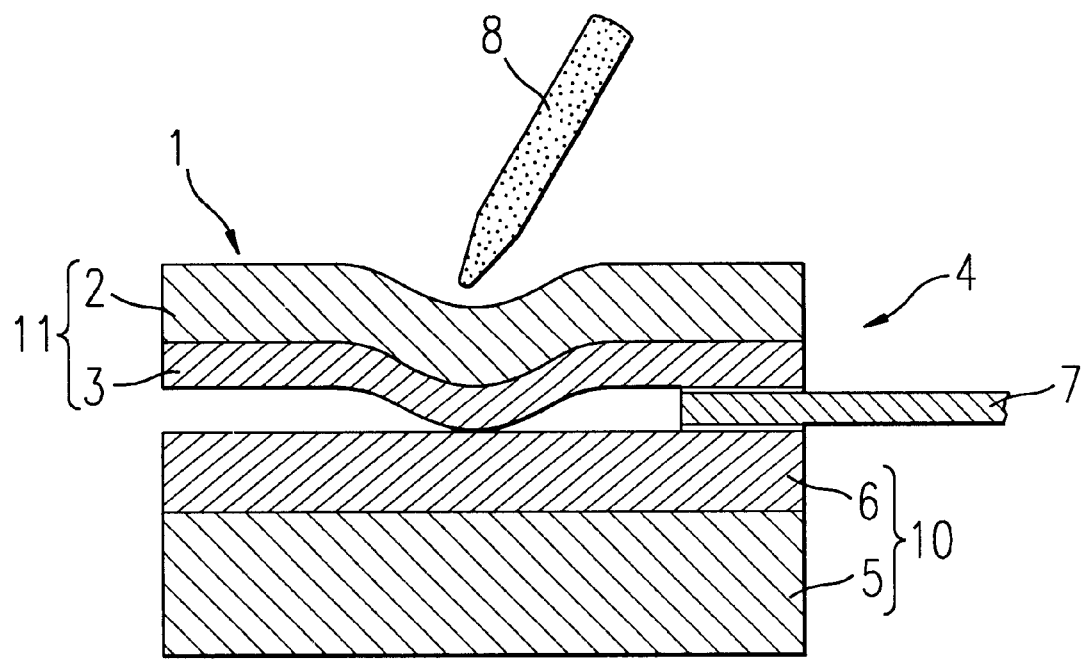
FIG. 2 is a cross sectional view of an embodiment of an analogue type touch panel of the present invention.

The present invention will be further explained based on FIG. 1 and FIG. 2. FIG. 1 shows a cross sectional structure of a transparent conductive film-coated substrate 1 which comprises a transparent insulated substrate 2 and transparent conductive film 3 provided thereon. FIG. 2 shows a cross sectional structure of one example of an analog type touch panel 4 which comprises a lower electrode 10 comprising a glass sheet 5 and a transparent conductive film 6 formed on the glass sheet 5, an upper electrode 11 which includes a transparent conductive film-coated substrate 1 comprising a transparent insulated substrate (film) 2 and a transparent conductive film 3 formed on the substrate 2, and a flexible tail 7 disposed therebetween.

The transparent conductive film of the present invention is suitable for a transparent conductive film for the lower electrode of a touch panel. In this example, the transparent conductive film of the present invention is used for the transparent conductive film 6.

The transparent conductive film 6 in the lower electrode 10 has a high sheet resistance and a pair of parallel electrodes on its side. Therefore when a voltage is applied through the pair of electrodes, the voltage causes a change of the electric potential along the transparent conductive film 6. The numeral 8 is a pen which presses the transparent conductive film bonded-substrate. When the pen 8 presses the transparent conductive film bonded-substrate 1, the upper electrode 11 and the lower electrode 10 contact each other and the two electrodes are electrically connected, whereby the position of the contact can be detected as a voltage.

A high quality analog touch panel 4 can be produced by conventional methods using the above mentioned transparent conductive film-coated substrate 1 as an electrode. For example, the upper electrode 11 which comprises the transparent conductive film-coated substrate 1 made by forming the transparent conductive film 3 on the transparent insulated film 2 is produced as follows: printing photoresist onto the transparent conductive film-coated substrate 1; etching it: printing silver ink and insulated ink on the substrate, forming the parallel electrodes and lead electrodes; printing conductive heat seal ink on the substrate: sticking by adhesive tape; and piercing to form electrodes. The lower electrode 10 can be made by forming the transparent conductive film 6 on the glass sheet 5, and the parallel electrodes and the lead electrodes are formed in substantially the same way as noted above. The touch panel 4 is produced by facing the upper electrode and the lower electrode toward one another, providing the flexible tail 7, and heat sealing so that an electrical connection is achieved.

Examples of other touch panels include: (a) a touch panel which is made by replacing the transparent insulated substrate 2 (included in the transparent conductive film-coated substrate (the upper electrode) 1, with a glass sheet; (b) replacing the glass substrate (the lower electrode) 5 with a plastic film; (c) or one of the above mentioned touch panels which further have a support of a glass sheet or a plastic sheet. The touch panel of the present invention can have any conventional structure as long as the transparent conductive film-bonded substrate of the present invention is used.

The touch panel is used by being mounted above an LCD. When a pen or other object is used as input, the applied force can penetrate through the touch panel and blur the LCD. Therefore the touch panel is preferably mounted above the LCD having a gap therebetween. Furthermore, it is preferred to use a glass sheet for either the upper electrode or the lower electrode to provide good mechanical strength. One recently developed LCD can be attached directly to a touch panel. Therefore the amount of reflective light decreases whereby a clear display can be obtained. In addition some improvements are suggested in order to prevent a fracture by falling. A touch panel which responds to the improvements of LCDs is desired.

Having generally described this invention, a further understanding can be obtained by reference to certain specific examples which are provided herein for purposes of illustration only and are not intended to be limiting unless otherwise specified.

EXAMPLES

Example 1

Using a target made of a mixture of indium oxide and tin oxide containing 5 weight % of tin oxide and using an in line type reactive DC magnetron sputtering apparatus, an ITO film having a thickness of 8 nm was formed on a glass substrate heated to 330° C. under an atmosphere of mixed gas of argon gas (5 vol.%) and nitrogen gases. The glass substrate was a glass sheet having a thickness of 1.1 mm. A film of silicon oxide having a thickness of 80 nm was formed onto both sides of the glass sheet by dip method. Table 2 shows the thickness of the film, the amount of tin doped in the film based on the amount of indium, the nitrogen content, the transmittance of the film, the transmittance of the film-coated substrate, the sheet resistance, the resistibility, the heat resistance and the moisture resistance.

A quantitative analysis of the composition of the film was carried out by ESCA. A sample having its composition analyzed by the Ratherford back scattering method was used as a standard when conducting ESCA.

The sheet resistance was measured by the four probe method.

The transmittances of the glass sheet (without the film) and the film-coated substrate were measured by a spectrophotometer at a wavelength of 550 nm. The transmittance of the film itself ($T_m$) was calculated by adding a sum of the reflectivity and the absorptivity of the glass substrate to the transmittance of the transparent conductive film-coated substrate ($T_b$). The sum of the reflectivity and the absorptivity was obtained by subtracting the transmittance of the glass substrate without the film ($T_g$) from 100%. That is: $T_m = (100\% - T_g) + T_b$.

The heat resistance is represented by a ratio of the sheet resistance after heat processing to that before heat processing. Heat processing was conducted by leaving the substrate in an atmosphere of 200° C. air for 60 minutes. From a practical view, a heat resistance ratio from 0.9 to 1.4 is preferable, with ratios closer to 1.0 being more preferable.

The touch panel shown in FIG. 2 was assembled by using the transparent conductive film-coated glass substrate obtained in Example 1. Specifically, the touch panel was made by using the transparent conductive film-coated glass substrate obtained in Example 1 for the lower electrode 10 and the upper electrode 11 respectively shown in FIG. 2, facing their surfaces which have transparent conductive film with a gap of 7 μm, and sealing them on their peripheries.

Although a heating step is included in the assembling process of the touch panel, the distribution of the sheet resistance in the touch panel (so-called "linearity") was good. this is believed to be because the transparent conductive film of the present invention has good heat resistance.

The test of moisture resistance was conducted as follows: a voltage of 8V was applied through the electrodes of the cell under an atmosphere of 60° C., 95%RH for 250 hours, then measuring a sheet resistance of the transparent conductive film which had a positive electric potential, was measured. A ratio of the sheet resistance to the initial sheet resistance was obtained. From a practical view, a moisture resistance ratio of from 0.9 to 1.9 is preferable, with ratios closer to 1.0 being more preferable. Clearly from results shown in Table 2, the moisture resistance was very good.

The obtained touch panel had a very high visible light transmittance.

Other touch panels were made in substantially the same way as Example 1 except that a commercial transparent conductive film-coated plastic film was used for the upper electrode. In this example, substantially the same result was obtained.

TABLE 1

| | Tin content of target (weight %) | Amount of nitrogen gas for film-forming (vol. %) | Oxidizing Gas for film-forming | | Film-forming apparatus | temperature of substrate (° C.) |
|---|---|---|---|---|---|---|
| | | | kind of gas | amount (vol. %) | | |
| Examples | | | | | | |
| 1 | 5 | 5 | — | 0 | in line | 330 |
| 2 | 5 | 3 | — | 0 | in line | 330 |
| 3 | 5 | 6 | — | 0 | in line | 330 |
| 4 | 10 | 7.7 | — | 0 | in line | 330 |
| 5 | 10 | 5 | — | 0 | batch | 350 |
| 6 | 10 | 6 | $CO_2$ | 2 | batch | 350 |
| 7 | 5 | 0 | $O_2$ | 2.8 | in line | 330 |
| 8 | 5 | 0 | $O_2$ | 5.2 | in line | 330 |
| 9 | 7.5 | 0 | — | 0 | batch | 350 |
| Comparative Examples | | | | | | |
| 1 | 10 | 0 | $O_2$ | 2.8 | in line | 330 |
| 2 | 10 | 0 | $O_2$ | 3 | in line | 330 |
| 3 | 1 | 0 | — | 0 | batch | 350 |
| 4 | 3 | 0 | — | 0 | batch | 350 |
| 5 | 20 | 0 | — | 0 | batch | 350 |

3–5, a batch type reactive DC magnetron sputtering apparatus was used. Characteristics of the films obtained are also shown in Table 2.

From Table 2, it is clear that the transparent conductive films of the embodiments of the present invention (Examples 1–9) have better heat resistance than the films of Comparative Examples 1–5. Also, all transparent conductive films of the present invention have high light transmittances (>90%) at a wavelength of 550 nm.

The ITO films of Examples 1–6 were doped with an appropriate amount of nitrogen. These examples show that a film having high sheet resistance can be made while keeping high transmittance and high heat resistance by adjusting the amount of doped nitrogen and the thickness of the films.

It is clear that the transparent conductive films of the examples of the present invention have better moisture resistance than the film of Comparative Example 1, which was made according to the prior art.

Other touch panels were assembled in substantially the same way as in Example 1 except using the transparent conductive film-coated glass substrate obtained in Examples 2–9 instead of Example 1. In these examples substantially the same result was obtained.

From the above mentioned results, it is clear that the transparent films of the present invention (Example 1–9) are very good transparent conductive films which provide high sheet resistance, high transmittance, good heat resistance and a good moisture resistance at the same time.

Accordingly, a touch panel, especially an analog type touch panel, which has superior characteristics can be made by using the transparent conductive film-coated substrate of the present invention for the electrodes (especially the lower electrode).

The present invention provides a transparent conductive film having high sheet resistance, high transmittance, good

TABLE 2

| | Thickness of film (nm) | Nitrogen content in film (wt. %) | Sn/In ratio in film (atomic %) | Transmittance of film itself (%) | Transmittance of film-coated substrate (%) | Sheet resistance (Ω/sq) | Resistibility ($10^{-4}$ Ω · cm) | Heat resistance | Moisture resistance |
|---|---|---|---|---|---|---|---|---|---|
| Examples | | | | | | | | | |
| 1 | 8 | 0.337 | 4.53 | 99.16 | 93.4 | 1040 | 8.3 | 1.19 | 1.60 |
| 2 | 8 | 0.215 | 4.47 | 99.06 | 93.3 | 610 | 8.2 | 1.19 | 1.15 |
| 3 | 12 | 0.425 | 4.66 | 97.56 | 91.8 | 1030 | 12.7 | 1.10 | 1.15 |
| 4 | 8.5 | 0.540 | 9.10 | 98.86 | 93.1 | 650 | 8.4 | 1.15 | 1.20 |
| 5 | 14 | 0.590 | 9.11 | 96.86 | 91.1 | 1060 | 8.5 | 0.90 | 1.22 |
| 6 | 14 | 0.413 | 8.99 | 97.86 | 92.1 | 990 | 9.1 | 0.92 | 1.30 |
| 7 | 7 | 0 | 4.25 | 99.46 | 93.7 | 650 | 4.6 | 1.19 | 1.88 |
| 8 | 10 | 0 | 4.76 | 98.76 | 93.0 | 650 | 6.4 | 0.99 | 1.80 |
| 9 | 8 | 0 | 6.88 | 99.56 | 93.8 | 580 | 4.6 | 0.98 | 1.60 |
| Comparative Examples | | | | | | | | | |
| 1 | 7 | 0 | 8.44 | 99.66 | 93.9 | 620 | 4.3 | 1.52 | 2.60 |
| 2 | 7.5 | 0 | 9.84 | 99.56 | 93.8 | 780 | 5.8 | 1.94 | 3.00 |
| 3 | 14 | 0 | 0.69 | 98.66 | 92.9 | 600 | 8.4 | 0.80 | 2.30 |
| 4 | 9 | 0 | 2.82 | 99.26 | 93.5 | 610 | 5.5 | 0.85 | 2.10 |
| 5 | 8 | 0 | 19.23 | 98.46 | 92.7 | 730 | 5.8 | 0.73 | 2.52 |

Examples 2–9 and Comparative Examples 1–5

Other films were made in substantially the same way as Example 1 except using the forming conditions shown in Table 1. In Examples 5, 6 and 9 and Comparative Examples heat resistance and a good moisture resistance by doping nitrogen into an ITO film or by adjusting the tin content of an ITO film. This film has higher sheet resistance and higher transparency and is more economical than conventional transparent conductive films. Accordingly, this invention provides a high quality touch panel, especially an analog type touch panel of high quality by using a transparent conductive film-coated substrate of the invention. Especially, a touch panel having a glass substrate for the substrate has many good characteristics and is highly suitable for a small size LCD.

The present application is based on Japanese Patent Application 10-178778, filed with the Japanese Patent Office on Jun. 25, 1998, the entire contents of which are hereby incorporated by reference.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate having a conductive film thereon produced by the process comprising:

forming an oxide film on a glass substrate heated to from 200 to 500° C. using a target comprising a mixed oxide of indium and tin under an atmosphere containing nitrogen gas, wherein said oxide film comprises a mixed oxide of indium and tin which is thereby doped with nitrogen in an amount of at least 0.01 and less than 0.6 weight %, wherein said oxide film has a geometrical thickness of from 5 to 25 nm and a light transmittance of more than 90% at a wavelength of 550 nm.

2. The substrate having a conductive film thereon according to claim 1, wherein the film has a sheet resistance of from 200 to 2000 Ω/sq.

3. The substrate having a conductive film thereon according to claim 1, wherein said forming step is performed by sputtering, vacuum deposition or ion plating.

4. The substrate having a conductive film thereon according to claim 3, wherein said forming step is performed by sputtering.

5. The substrate having a conductive film thereon according to claim 1, wherein the target contains tin oxide within a range of from 1 to 15 weight %.

6. The substrate having a conductive film thereon according to claim 1, wherein the content of tin in said oxide film is from 4.2 to 12.0 atomic %.

7. The substrate having a conductive film thereon according to claim 1, wherein the glass substrate is a soda lime glass sheet having at least one surface covered by a film of silicon oxide.

8. The substrate having a conductive film thereon according to claim 1, wherein said nitrogen is an amount of at least 0.2 weight % and less than 0.6 weight %.

9. The substrate having a conductive film thereon according to claim 1, wherein the content of tin in said oxide film is from 4.2. to 8.3 atomic %.

10. The substrate having a conductive film thereon according to claim 1, wherein said nitrogen is in an amount of at least 0.4 weight % and less than 0.6 weight %.

11. The substrate having a conductive film thereon according to claim 1, wherein the glass substrate has a thickness of from 0.4 to 1.8 mm.

12. A touch panel, comprising:

a pair of electrodes, wherein a least one of said electrodes comprises the substrate having a conductive film thereon as claimed in claim 1.

13. A substrate having a conductive film thereon produced by the process comprising:

forming an oxide film on a glass substrate heated to from 200 to 500° C. comprising a mixed oxide of indium and tin under an atmosphere of inert gas or mixed gas of inert gas and oxidizing gas, wherein said oxide film consists essentially of a mixed oxide of indium and tin which contains tin within a range of 4.2 to 8.3 atomic % based on indium, and said oxide film has a geometrical thickness of from 5 to 20 nm and a light transmittance of more than 90% at a wavelength of 550 nm.

14. The substrate having a conductive film thereon according to claim 13, wherein the film has a sheet resistance of from 200 to 2000 Ω/sq.

15. The substrate having a conductive film thereon according to claim 13, wherein said forming step is performed by sputtering, vacuum deposition or ion plating.

16. The substrate having a conductive film thereon according to claim 13, wherein the target contains tin oxide within a range of from 4.5 to 8 weight %.

17. The substrate having a conductive film thereon according to claim 13, wherein the glass substrate is a soda lime glass sheet having a least one surface covered by a film of silicon oxide.

18. The substrate having a conductive film thereon according to claim 13, wherein the content of tin in said oxide film is from 4.2 to 7.5 atomic %.

19. The substrate having a conductive film thereon according to claim 13, wherein the glass substrate has a thickness of from 0.4 to 1.8 mm.

20. A touch panel, comprising:

a pair of electrodes, wherein a least one of said electrodes comprises the substrate having a conductive film thereon as claimed in claim 13.

21. A method of making a transparent conductive film, comprising:

forming an oxide film on a glass substrate heated from 200 to 500° C. using a target comprising a mixed oxide of indium and tin under an atmosphere containing nitrogen gas, wherein said oxide film comprises a mixed oxide of indium and tin which is doped with nitrogen in an amount of at least 0.01 and less than 0.6 weight %, wherein said oxide film has a geometrical thickness of from 5 to 25 nm and a light transmittance of more than 90% at a wavelength of 550 nm.

22. A method of making a transparent conductive film, comprising:

forming an oxide film on a glass substrate heated from 200 to 500° C. using a target comprising a mixed oxide of indium and tin under an atmosphere of an inert gas or mixed gas of inert gas and oxidizing gas, wherein said oxide film consists essentially of a mixed oxide of indium and tin which contains tin within a range of 4.2 to 8.3 atomic % based on indium, and said oxide film has a geometrical thickness of from 5 to 20 nm and a light transmittance of more than 90% at a wavelength of 550 nm.

23. A substrate having a conductive film thereon produced by the process according to claim 1, wherein the substrate having a conductive film thereon has a ratio of a sheet resistance after heat processing to that before heat processing of from 0.9 to 1.4, wherein the heat processing is conducted by leaving the substrate in an atmosphere of 200° C. air for 60 minutes.

24. A substrate having a conductive film thereon produced by the process according to claim 13, wherein the substrate having a conductive film thereon has a ratio of a sheet resistance after heat processing to that before heat processing of from 0.9 to 1.4, wherein the heat processing is conducted by leaving the substrate in an atmosphere of 200° C. air for 60 minutes.

* * * * *